US009087900B1

(12) United States Patent
Kim

(10) Patent No.: US 9,087,900 B1
(45) Date of Patent: Jul. 21, 2015

(54) SEMICONDUCTOR DEVICE AND METHOD FOR FABRICATING THE SAME

(71) Applicant: SAMSUNG ELECTRONICS CO., LTD., Gyeonggi-do (KR)

(72) Inventor: Jin-Bum Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/149,153

(22) Filed: Jan. 7, 2014

(51) Int. Cl.
*H01L 31/0328* (2006.01)
*H01L 31/0336* (2006.01)
*H01L 31/072* (2012.01)
*H01L 31/109* (2006.01)
*H01L 29/78* (2006.01)
*H01L 29/66* (2006.01)
*H01L 21/02* (2006.01)

(52) U.S. Cl.
CPC ...... *H01L 29/7848* (2013.01); *H01L 21/02645* (2013.01); *H01L 21/02667* (2013.01); *H01L 29/66818* (2013.01); *H01L 29/7851* (2013.01)

(58) Field of Classification Search
CPC ............ H01L 29/66795; H01L 29/66772; H01L 29/785; H01L 29/78645; H01L 29/78648; H01L 27/0886; H01L 27/0924; H01L 27/10826; H01L 27/10879; H01L 27/1211

See application file for complete search history.

(56) References Cited

U.S. PATENT DOCUMENTS

| | | | |
|---|---|---|---|
| 8,207,038 B2 | 6/2012 | Cheng et al. | |
| 8,313,999 B2 | 11/2012 | Cappellani et al. | |
| 8,362,574 B2 | 1/2013 | Kawasaki et al. | |
| 8,367,498 B2 | 2/2013 | Chang et al. | |
| 2008/0265321 A1* | 10/2008 | Yu et al. | 257/344 |
| 2011/0291188 A1 | 12/2011 | Cheng et al. | |
| 2012/0091538 A1 | 4/2012 | Lin et al. | |
| 2012/0104472 A1 | 5/2012 | Xu et al. | |
| 2012/0138886 A1 | 6/2012 | Kuhn et al. | |
| 2013/0001705 A1 | 1/2013 | Su et al. | |
| 2013/0026539 A1 | 1/2013 | Tang et al. | |

* cited by examiner

*Primary Examiner* — Hoai V Pham

(74) *Attorney, Agent, or Firm* — F. Chau & Associates, LLC

(57) ABSTRACT

A semiconductor device is provided. At least two active fins protrude from a substrate. A gate pattern crosses the at least two active fins, covering part of each active fin. A seed layer is disposed on other part of the each active fin. The other part of the each active fin is not covered with the gate pattern. An epitaxial layer is disposed on the seed layer.

16 Claims, 20 Drawing Sheets

SEMICONDUCTOR DEVICE AND METHOD FOR FABRICATING THE SAME

TECHNICAL FIELD

The present inventive concept relates to a semiconductor device and a method for fabricating the same.

DISCUSSION OF RELATED ART

Process technology has been developed to densely integrate complementary metal oxide semiconductor (CMOS) transistors, minimizing short channel effects of CMOS transistors and securing a high-speed operation of CMOS transistors at a low operating voltage. CMOS transistors having a three dimensional structure, such as fin field effect transistors (FinFETs), have been introduced. Compared to planar transistors, FinFETs may reduce a short channel effect due to their three dimensional channel structure.

SUMMARY

According to an exemplary embodiment of the present inventive concept, a method for fabricating a semiconductor device is provided. At least one active fin is formed on a substrate. Each active fin protrudes from the substrate. A gate pattern is formed on the substrate. The gate pattern crosses the each active fin. The gate pattern covers part of the each active fin. An amorphous material is formed on other part of the each active fin. The other part of the each active fin is not covered with the gate pattern. The seed layer is formed by crystallizing amorphous material. An epitaxial layer is formed on the seed layer.

According to an exemplary embodiment of the present inventive concept, a method for fabricating a semiconductor device is provided. A gate pattern is formed on a substrate. Active fins are formed on the substrate. The gate pattern crosses the active fins. An amorphous material is formed on the active fins. A seed layer is formed by crystallizing the amorphous material. The seed layer has a stress material at a first concentration. An epitaxial layer is formed on the seed layer. The epitaxial layer has the stress material at a second concentration. The second concentration is greater than the first concentration.

According to an exemplary embodiment of the present inventive concept, a semiconductor device is provided. At least two active fins protrude from a substrate. A gate pattern crosses the at least two active fins, covering part of each active fin. A seed layer is disposed on other part of the each active fin. The other part of the each active fin is not covered with the gate pattern. An epitaxial layer is disposed on the seed layer.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EXEMPLARY EMBODIMENTS

Figure 1:
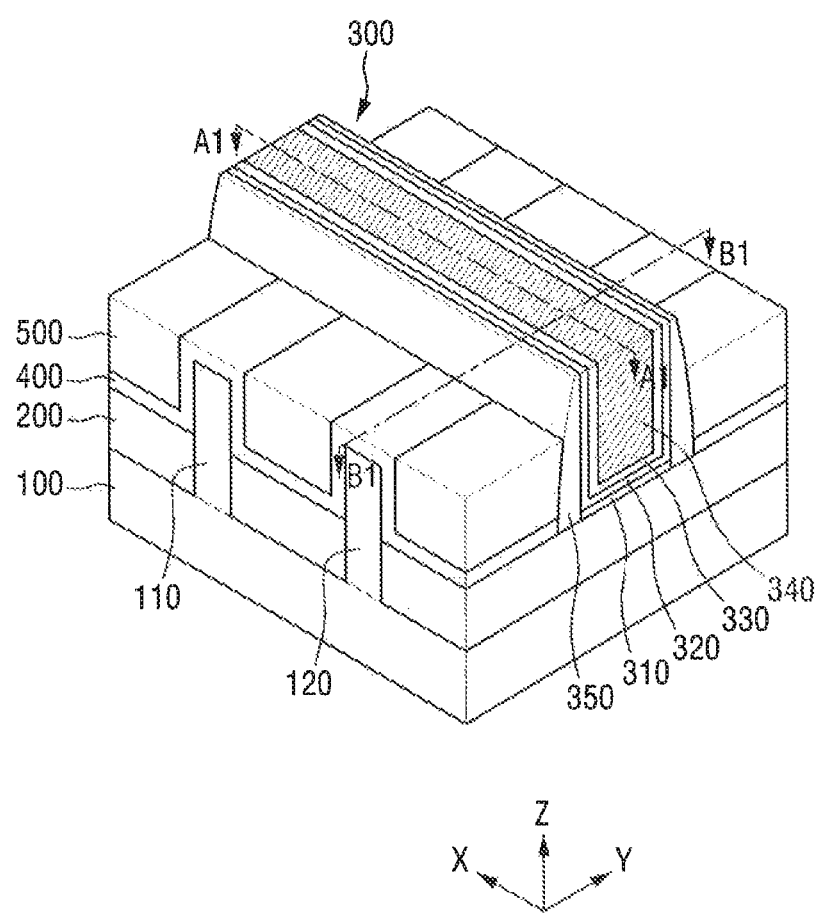
FIG. 1 is a perspective view illustrating a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

A semiconductor device and a method for fabricating the same to be described hereinafter relate to forming a seed layer using a directional deposition method after partially removing a fin and forming an epitaxial layer (e.g., SiGe layer) on the seed layer. Fins may be formed on an epitaxial layer to improve performance of the finfet. The epitaxial layer may improve carrier mobility of a channel region through application of stress to the fins. For example, if a fin field effect transistor (finfet) is a P-type transistor, the epitaxial layer may include a compression stress material. The compression stress material may be a material, such as SiGe, having a lattice constant higher than that of Si. For an N-type finfet, the epitaxial layer may include substantially the same material as the material of a substrate or a tensile stress material. For example, if the substrate is made of Si, the tensile stress material may be Si or a material, such as SiC, having smaller lattice constant than the lattice constant of Si. If each epitaxial layer for a fin are merged, the stress effect that is applied by the merged epitaxial layer may be increased about twice the stress effect in the case where each epitaxial layer for a fin is not merged with other epitaxial layers. However, merging of each epitaxial layer may cause a resulting epitaxial layer to have different crystal orientations. The growing speed and crystal orientation of the epitaxial layer differ depending on the fin pitch and fin width, and this causes occurrence of a problem in a subsequent process. For example, at first, the epitaxial layer is grown in the crystal orientation of <111> from the fin, and then is grown in the crystal orientation of <100> after the epitaxial layers come in contact with each other. While the epitaxial layer is grown in the crystal orientation of <111> in a region where the fin pitch is relatively wide, the epitaxial layer is grown in the direction of <100> in a region where the epitaxial layers is contact with each other, and the shape of the epitaxial layer becomes non-uniform. According to an exemplary embodiment of the present inventive concept, the abnormal growth of the epitaxial layer due to the to difference between fin pitches and fin widths may be prevented.

Figure 2:
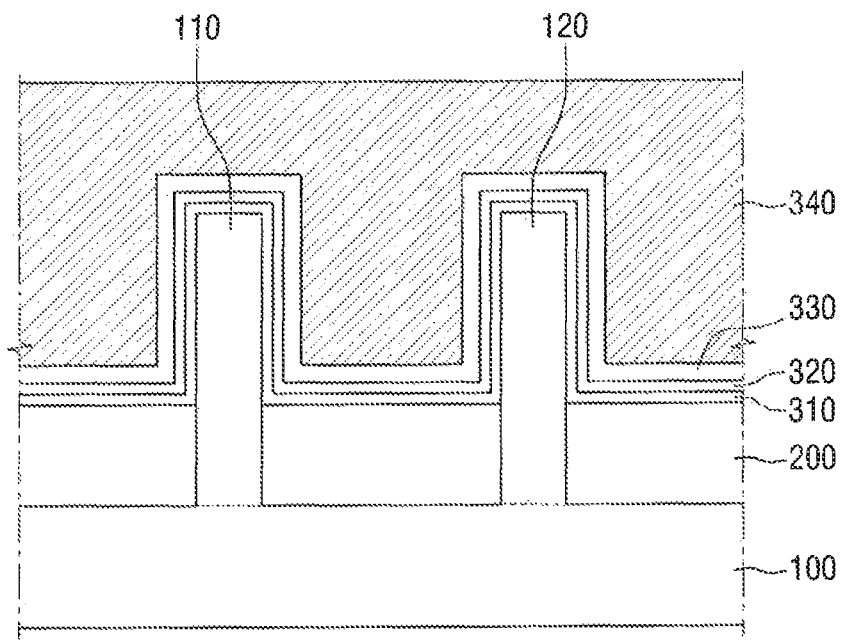
FIG. 2 is a cross-sectional view taken along line A1-A1 in FIG. 1.

FIG. 1 is a perspective view illustrating a semiconductor device according to an exemplary embodiment of the present inventive concept. FIG. 2 is a cross-sectional view taken along line A1-A1 in FIG. 1, and FIG. 3 is a cross-sectional view taken along line B1-B1 in FIG. 1.

Figure 3:
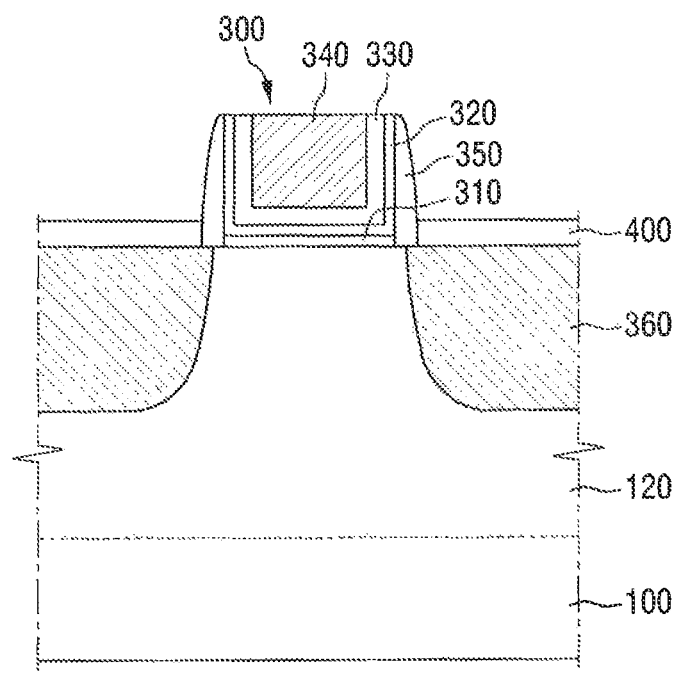
FIG. 3 is a cross-sectional view taken along line B1-B1 in FIG. 1.

Referring to FIGS. 1 to 3, a semiconductor device according to an exemplary embodiment of the present inventive concept includes a substrate 100, an isolating film pattern 200, a first active fin 110, a second active fin 120, a gate pattern 300, a source/drain 360, a seed layer 400, and an epitaxial layer 500.

The substrate 100 may include Si, Ge, SiGe, GaP, GaAs, SiC, SiGeC, InAs, or InP. The substrate 100 may be a rigid substrate, such as a silicon substrate, an SOI (Silicon On Insulator) substrate, a gallium arsenide substrate, a silicon germanium substrate, a ceramic substrate, a quartz substrate, or a glass substrate for display. Alternatively, the substrate 100 may include a flexible plastic substrate including polyimide, polyester, polycarbonate, polyethersulfone, polymethylmethacrylate, polyethylene naphthalate, or polyethyleneterephthalate.

The isolation film pattern 200 is formed on the substrate 100 and is used for device isolation. The isolation film pattern 200 may be an insulating film, such as an HDP oxide film, an SOG oxide film, or a CVD oxide film, but is not limited thereto.

The first active fin 110 is formed to project from the substrate. The first active fin 110 may extend along a second direction Y. The first active fin 110 may be a part of the substrate 100. The isolation film pattern 200 covers an upper surface of the substrate 100 and a lower part of the first active fin 110.

The second active fin 120 projects from the substrate, and is formed to be spaced apart from the first active fin 110. The second active fin 120 extends along the second direction Y. The second active fin 120 may be a part of the substrate 100. The isolation film pattern 200 may cover the upper surface of the substrate 100 and a lower part of the second active fin 120.

The gate pattern 300 is formed on the first and second active fin 110 and 120 in a direction crossing the first and second active fins 110 and 120. The gate pattern 300 extends along a first direction X. The gate pattern 300 includes an interface film pattern 310, a gate insulating film pattern 320, a work function adjustment film pattern 330, a gate metal pattern 340, and gate spacers 350, which are sequentially formed on the first and second active fins 110 and 120.

The interface film pattern 310 is formed on the isolation film pattern 200 and the first and second active fins 110 and 120. The interface film pattern 310 may serve to prevent a defective interface from being formed between the isolation film pattern 200 and the gate insulating film pattern 320. The interface film pattern 310 may include a low-k material layer of which the dielectric constant k is substantially equal to or lower than about 9, for example, a silicon oxide film (where, k is about 4) or a silicon oxynitride film (where, k is about 4 to about 8 depending on the amounts of oxygen atoms and nitrogen atoms). Further, the interface film pattern 310 may include silicate or a combination of the above-exemplified films.

The gate insulating film pattern 320 is formed on the interface film pattern 310. However, in the case where the interface film pattern 310 does not exist, the gate insulating film pattern 320 may be formed on the isolation film pattern 200 and the first and second active fins 110 and 120. The gate insulating film pattern 320 may include a high-k material. For example, the gate insulating film pattern 320 may include HfSiON, $HfO_2$, $ZrO_2$, $Ta_2O_5$, $TiO_2$, $SrTiO_3$, $BaTiO_3$, or $SrTiO_3$. The thickness of the gate insulating film pattern 320 may depend on the kind of the material included in the gate insulating film pattern 320. For example, in the case where the gate insulating film pattern 320 is $HfO_2$, the gate insulating film pattern 320 may have a thickness substantially equal to or smaller than about 50 Å. Alternatively, the thickness of the gate insulating film pattern 320 may range from about 5 Å to about 50 Å.

The work function adjustment film pattern 330 is formed on the gate insulating film pattern 320. The work function adjustment film pattern 330 is in contact with the gate insulating film pattern 320. The work function adjustment film pattern 330 is used for work function adjustment. The work function adjustment film pattern 330 may include, for example, metal nitride. For example, the work function adjustment film pattern 330 may include, but is not limited to, Mo, Pd, Ru, Pt, TiN, WN, TaN, Ir, TaC, RuN, TiAl, TaAlC, TiAlN, or MoN. The work function adjustment film pattern 330 may be formed of, for example, a single film of TiN or a double film of a lower TiN film and an upper TaN film, but is not limited thereto.

A capping film (not shown here) may be formed between the gate insulating film pattern 320 and the work function adjustment film pattern 330. The capping film may be used for the work function adjustment. For example, the capping film serves as a buffer between the gate insulating film pattern 320 and the work function adjustment film pattern 330, and in the case where the capping film exists, the work function may be adjusted more precisely in comparison to a case where only the work function adjustment film pattern 330 exists. The capping film may include, but is not limited to, LaO, GdO, DyO, SrO, BaO, aluminum oxide film, or aluminum metal oxide film.

The gate metal pattern 340 is formed on the work function adjustment film pattern 330. The gate metal pattern 340 is in contact with the work function adjustment film pattern 330. For example, the gate metal pattern 340 fills a space defined by two neighboring active fins, for example, the first active fin 110 and the second active fin 120. The gate metal pattern 340 may include a conductive material, for example, W or Al, but is not limited thereto.

The gate spacer 350 is formed on the substrate 100, defining a space in which the interface film pattern 310, the gate insulating film pattern 320, 330, and 340 are formed. The gate spacer 350 may include at least one of a nitride film, an oxynitride film, and a low-k material. The gate spacer 350 has one curved side surface. However, the present inventive concept is not limited thereto, and the shape of the gate spacer 350 may differ from that as described above. For example, unlike that as described above, the gate spacer 350 may have "I" shape or in "L" shape. The gate spacer 350 may be formed of a single layer or a double to layer.

The source/drain 360 is formed on at least one of both sides of the gate pattern 300, and is formed on the first and second active fins 110 and 120. The source/drain 360 and the gate pattern 300 are insulated by the gate spacer 350.

A silicide film (not shown) may be formed on the source/drain 360, and various contacts may be formed on the silicide film. The silicide film may be formed between the source/drain 360 and the contact, and may serve to reduce a sheet resistance and a contact resistance.

The seed layer 400 is formed on the first and second active fin 110 and 120, and is made of a single crystal material. First, an amorphous material may be conformally formed to cover the first and second active fins 110 and 120, and the seed layer 400 may be formed by crystallizing the amorphous material. For example, the thickness of the amorphous material may be about 10 Å to about 500 Å. The amorphous material may include at least one of Si, Ge, B, As, P, C, and In. Accordingly, the seed layer 400 may include at least one of Si, Ge, B, As, P, C, and In. The amorphous material is crystallized using a SPE (Solid Phase Epitaxy) process. For example, the amorphous material may be crystallized using a RTP (Rapid Thermal Process) or an MSA (Milli-Second Anneal) process. In this case, the process temperature may be about 500° C. to about 1,300° C.

The epitaxial layer 500 is formed on the seed layer 400. A preliminary epitaxial layer may be epitaxially grown on the seed layer 400, covering the seed layer 400. The preliminary epitaxial layer may have a thickness such that a space between two neighboring active fins 110 and 120 is filled. The preliminary epitaxial layer may be removed so that the epitaxial layer 500 is formed and an upper surface of the seed layer 400 may be exposed. For example, the exposed upper surface of the seed layer 400 is disposed between two neighboring active fins 110 and 120. If the seed layer 400 exists, unlike a case where the seed layer 400 does not exist, the epitaxial layer 500 is grown in the crystal orientation of <100> and <111> from the seed layer 400 to prevent the epitaxial layer 500 from growing non-uniformly. At this time, the epitaxial layer 500 may include a stress material (e.g., Ge), and the concentration of the stress material included in the epitaxial layer 500 may be higher than the concentration of the stress material (e.g., Ge) included in the seed layer 400.

Figure 4:
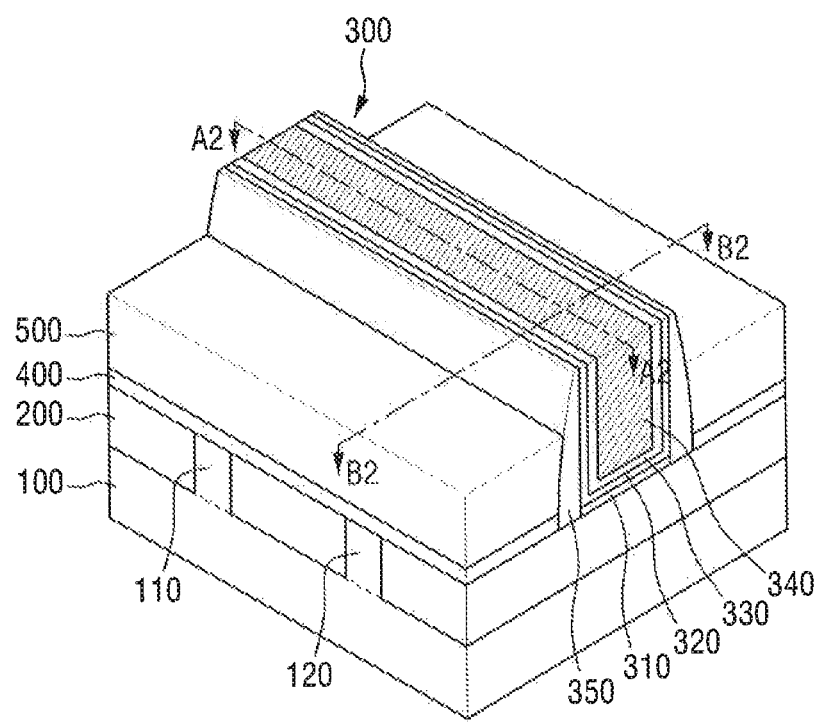
FIG. 4 is a perspective view illustrating a semiconductor device according to an exemplary embodiment of the present inventive concept.
Figure 5:
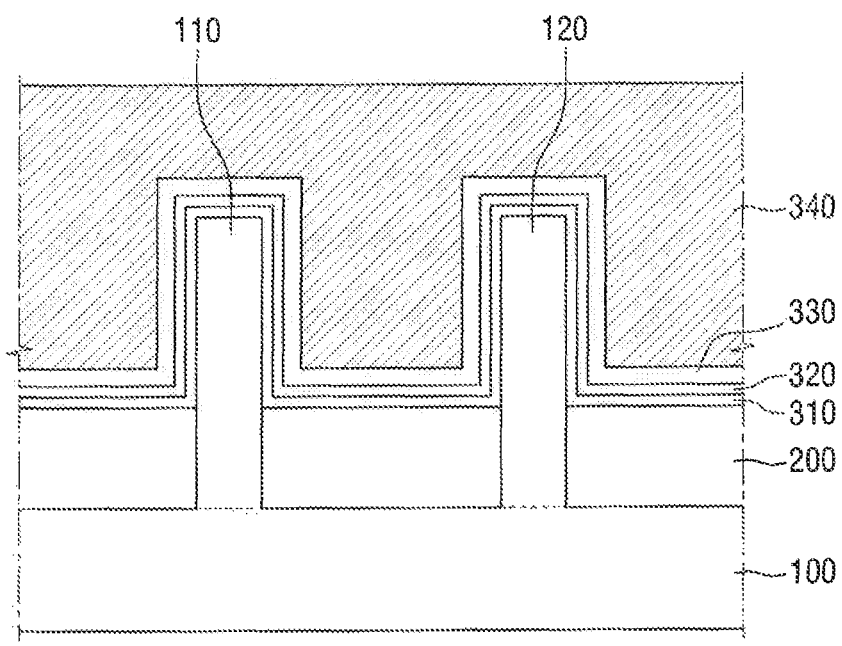
FIG. 5 is a cross-sectional view taken along line A2-A2 in FIG. 4.
Figure 6:
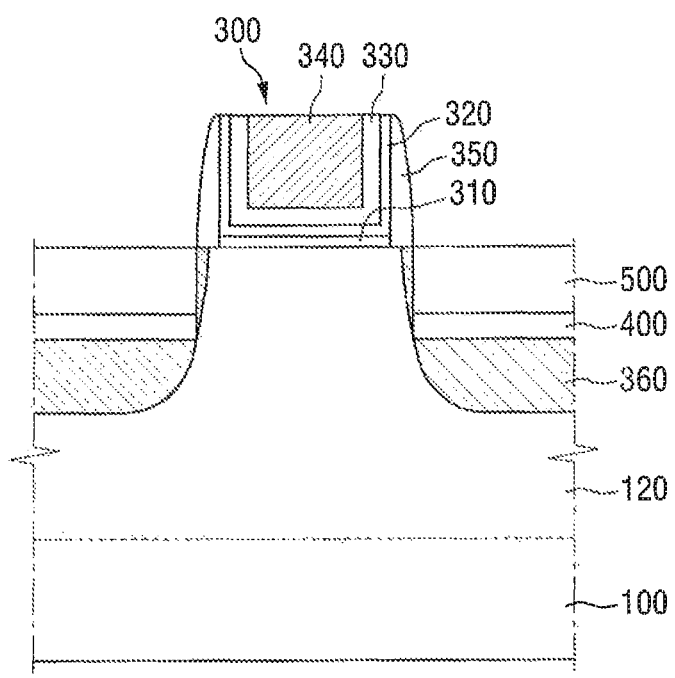
FIG. 6 is a cross-sectional view taken along line B2-B2 in FIG. 4.

Referring to FIGS. 4 to 6, a semiconductor device according to an exemplary embodiment of the present inventive concept will be described.

FIG. 4 is a perspective view illustrating a semiconductor device according to an exemplary embodiment of the present inventive concept. FIG. 5 is a cross-sectional view taken along line A2-A2 in FIG. 4, and FIG. 6 is a cross-sectional view taken along line B2-B2 in FIG. 4.

Referring to FIGS. 4 to 6, a semiconductor device according to an exemplary embodiment of the present inventive concept includes a substrate 100, an isolating film pattern 200, a first active fin 110, a second active fin 120, a gate pattern 300, a source/drain 360, a seed layer 400, and an epitaxial layer 500.

The substrate 100 may include Si, Ge, SiGe, GaP, GaAs, SiC, SiGeC, InAs, or InP. The substrate 100 may be a rigid substrate, such as a silicon substrate, an SOI (Silicon On Insulator) substrate, a gallium arsenide substrate, a silicon germanium substrate, a ceramic substrate, a quartz substrate, or a glass substrate for display. Alternatively, the substrate 100 may be a flexible plastic substrate including, but is not limited to, polyimide, polyester, polycarbonate, polyethersulfone, polymethylmethacrylate, polyethylene naphthalate, or polyethyleneterephthalate.

The isolation film pattern 200 is formed on the substrate 100 and is used for device isolation. The isolation film pattern 200 may be an insulating film, such as an HDP (High Density Plasma) oxide film, an SOG (Silicon On Glass) oxide film, or a CVD (Chemical Vapor Deposition) oxide film, but is not limited thereto.

The first active fin 110 extends along a second direction Y. The first active fin 110 may be a part of the substrate 100. The isolation film pattern 200 covers an upper surface of the substrate 100 and side surfaces of the first active fin 110.

The second active fin 120 is spaced apart from the first active fin 110. The second active fin 120 extends along the second direction Y. The second active finm 120 may be a part of the substrate 100. The isolation film pattern 200 covers the upper surface of the substrate 100 and side surfaces of the second active fin 120.

The gate pattern 300 is formed on first and second active fins 110 and 120 in a direction crossing the first and second active fins 110 and 120. The gate pattern 300 extends along a first direction X. The gate pattern 300 may include an interface film pattern 310, a gate insulating film pattern 320, a work function adjustment film pattern 330, a gate metal pattern 340, and gate spacers 350, which are sequentially formed on the first and second active fins 110 and 120.

The interface film pattern 310 is formed on the isolation film pattern 200 and the first and second active fins 110 and 120. The interface film pattern 310 may serve to prevent a defective interface from being formed between the isolation film pattern 200 and the gate insulating film pattern 320. The interface film pattern 310 may include a low-k material layer of which the dielectric constant k is equal to or lower than about 9, for example, a silicon oxide film (where, k is about 4) or a silicon oxynitride film (where, k is about 4 to about 8 depending on the contents of oxygen atoms and nitrogen atoms). Further, the interface film pattern 310 may include silicate or a combination of the above-exemplified films.

The gate insulating film pattern 320 is formed on the interface film pattern 310. However, in the case where the interface film pattern 310 does not exist, the gate insulating film pattern 320 may be formed on the isolation film pattern 200 and the first and second active fins 110 and 120. The gate insulating film pattern 320 may include a high-k material. Specifically, the gate insulating film pattern 320 may include HfSiON, $HFO_2$, $ZrO_2$, $Ta_2O_5$, $TiO_2$, $SrTiO_3$, $BaTiO_3$, or $SrTiO_3$. The thickness of the gate insulating film pattern 320 may be various depending on the kind of the material included in the gate insulating film pattern 320. For example, in the case where the gate insulating film pattern 320 is $HfO_2$, the gate insulating film pattern 320 may have a thickness equal to or smaller than about 50 Å (about 5 Å to about 50 Å), but is not limited thereto.

The work function adjustment film pattern 330 is formed on the gate insulating film pattern 320. The work function adjustment film pattern 330 is in contact with the gate insulating film pattern 320. The work function adjustment film pattern 330 is used for work function adjustment. The work function adjustment film pattern 330 may include, for example, metal nitride. For example, the work function adjustment film pattern 330 may include at least one of Mo, Pd, Ru, Pt, TiN, WN, TaN, Ir, TaC, RuN, TiAl, TaAlC, TiAlN, and MoN. For example, the work function adjustment film pattern 330 may be formed of, for example, a single film made of TiN or a double film made of a lower TiN film and an upper TaN film, but is not limited thereto. A capping film (not shown) may be formed between the gate insulating film pattern 320 and the work function adjustment film pattern 330. The capping film may be used for the work function adjustment. For example, the capping film serves as a buffer between the gate insulating film pattern 320 and the work function adjustment film pattern 330, and in the case where the capping film exists, the work function may be adjusted more precisely in comparison to a case where only the work function adjustment film pattern 330 exists. The capping film may include, for example, at least one of LaO, GdO, DyO, SrO, BaO, aluminum oxide film, and aluminum metal oxide film, but is not limited thereto.

The gate metal pattern 340 is formed on the work function adjustment film pattern 330. The gate metal pattern 340 is in contact with the work function adjustment film pattern 330. For example, the gate metal pattern 340 fills a space defined by the spacer 350. The gate metal pattern 340 may include a conductive material, for example, W or Al, but is not limited thereto.

The gate spacer 350 is formed on at least one side surface of the gate pattern 300. The gate spacer 350 may include at least one of a nitride film, an oxynitride film, and a low-k material. The gate spacer 350 has one curved side surface. However, the present inventive concept is not limited thereto, and the shape of the gate spacer 350 may differ from that as described above. For example, unlike that as described above, the gate spacer 350 may have "I" shape or "L" shape. The gate spacer 350 is formed of a single layer. However, the present inventive concept is not limited thereto, and the gate spacer 350 may be formed of a double layer.

The source/drain 360 is formed on at least one of both sides of the gate pattern 300, and may be formed on the first and second active fins 110 and 120. The source/drain 360 and the gate pattern 300 are insulated by the gate spacer 350.

A silicide film (not shown here) may be formed on the source/drain 360, and various contacts may be formed on the silicide film. The silicide film may be formed between the source/drain 360 and the contact, and may serve to reduce a sheet resistance and a contact resistance.

The seed layer 400 is formed on the first and second active fins 110 and 120 and the isolation film pattern 200, and is made of a single crystal material. The seed layer 400 is in direct contact with the first and second active fins 110 and 120. An amorphous material is formed on the first and second active fins 110 and 120, and the isolation film pattern 200, and then the amorphous material is crystallized to form the seed layer 400. The upper surface of the first and second active fins 110 and 120 that is not covered by the gate structure 300 has substantially the same height as the upper surface of the isolation film pattern 200. The thickness of the amorphous material may be about 10 Å to about 500 Å. The amorphous material may include at least one of Si, Ge, B, As, P, C, and In. Accordingly, the seed layer 400 may include at least one of Si, Ge, B, As, P, C, and In. When the amorphous material is crystallized, a SPE (Solid Phase Epitaxy) process may be used, and for example, the amorphous material may be crystallized using a RTP (Rapid Thermal Process) or an MSA (Milli-Second Anneal) process. In this case, the process temperature may be about 500° C. to about 1300° C.

The epitaxial layer 500 is formed on the seed layer 400. The epitaxial layer 500 may be epitaxially grown on the seed layer 400. When the epitaxial layer 500 is grown, impurities are included in the epitaxial layer 500 to form the source/drain. The height of the source/drain formed as above may be equal to or higher than that before the first and second active fins 110 and 120 are recessed. The epitaxial layer 500 is continuously formed on the seed layer having a planar surface and thus the epitaxial layer 500 may be prevented from growing non-uniformly. The epitaxial layer 500 may include a stress material (e.g., Ge), and the concentration of the stress material included in the epitaxial layer 500 may be higher than the concentration of the stress material (e.g., Ge) included in the seed layer 400.

Hereinafter, a semiconductor device according to an exemplary embodiment of the present inventive concept will be described with reference to FIGS. 7 to 9.

Figure 7:
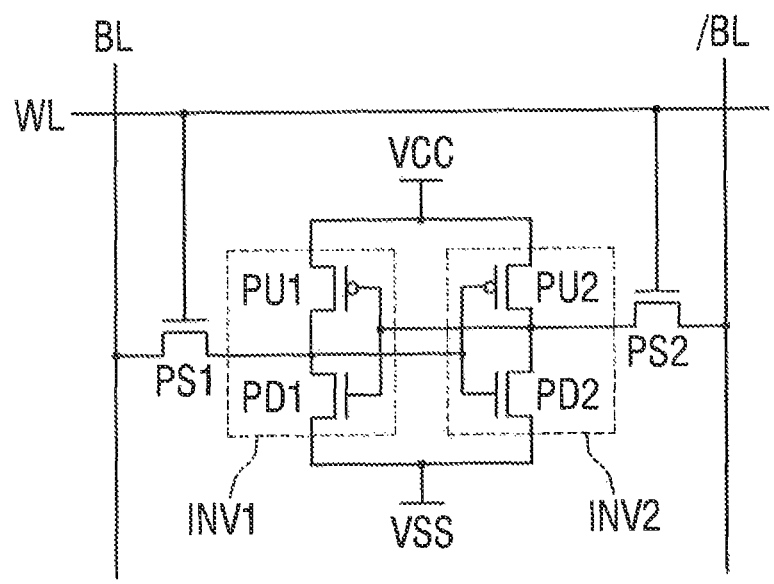
FIGS. 7 and 8 are a circuit diagram and a layout diagram illustrating a semiconductor device according to an exemplary embodiment of the present inventive concept.
Figure 8:
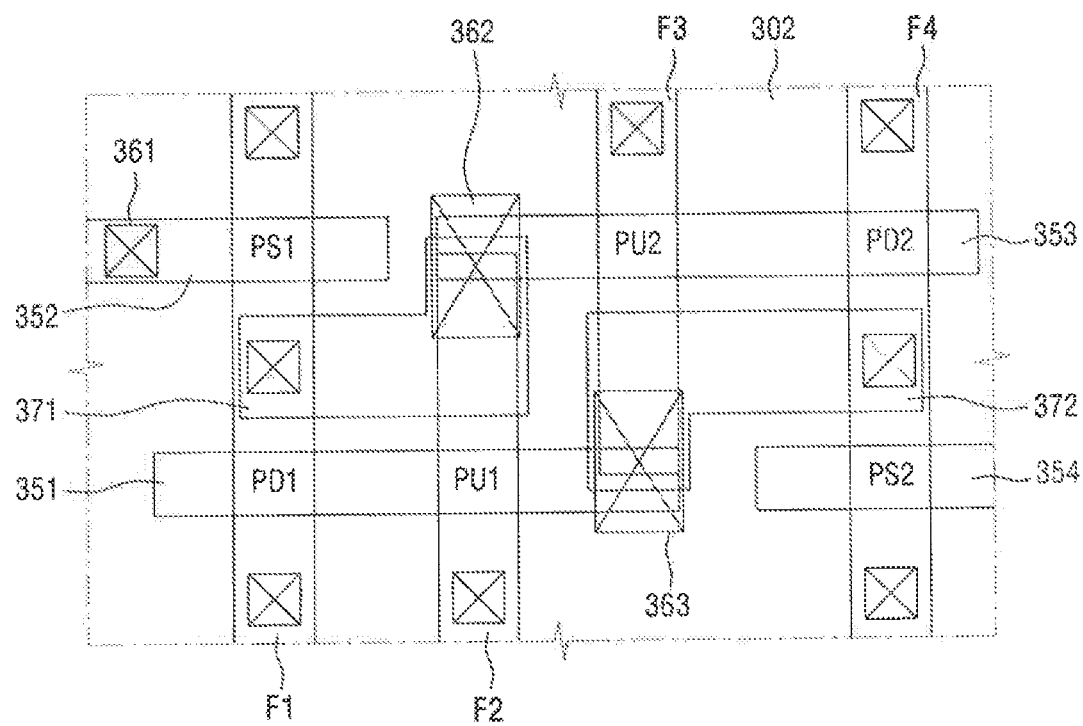
Figure 9:
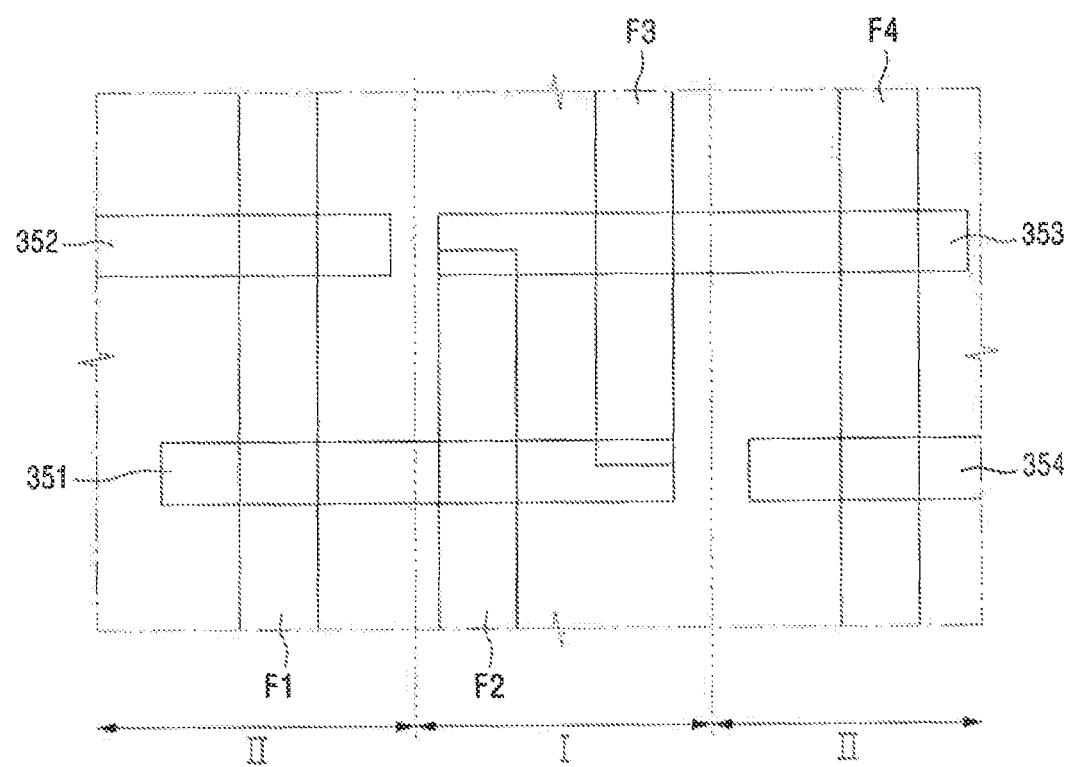
FIG. 9 illustrates only a plurality of fins and a plurality of gate electrodes in the layout diagram of FIG. 8.

FIGS. 7 and 8 are a circuit diagram and a layout diagram illustrating a semiconductor device according to an exemplary embodiment of the present inventive concept. FIG. 9 is a layout diagram illustrating a plurality of fins and a plurality of gate electrodes of FIG. 8. The semiconductor device according to an exemplary embodiment of the present inventive concept may be applied to semiconductor devices that use fin transistors, but FIGS. 7 to 9 exemplarily illustrate a static random access memory (SRAM) cell structure.

Referring to FIG. 7, the semiconductor device includes a pair of inverters INV1 and INV2 connected in parallel between a power supply node Vcc and a ground node Vss, and a first path transistor PS1 and a second pass transistor PS2 connected to output nodes of the respective inverters INV1 and INV2. The first pass transistor PS1 and the second pass transistor PS2 are connected to a bit line BL and a complementary bit line /BL. Gates of the first pass transistor PS1 and the second pass transistor PS2 are connected to a word line WL.

The first inverter INV1 includes a first pull-up transistor PU1 and a first pull-down transistor PD1 which are connected in series, and the second inverter INV2 includes a second pull-up transistor PU2 and a second pull-down transistor PD2. The first pull-up transistor PU1 and the second pull-up transistor PU2 are p-type metal oxide semiconductor (PMOS) transistors, and the first pull-down transistor PD1 and the second pull-down transistor PD2 may be n-type metal oxide semiconductor (NMOS) transistors.

The first inverter INV1 and the second inverter INV2 may constitute one latch circuit in a manner that an input node of the first inverter INV1 is connected to an output node of the second inverter INV2, and an input node of the second inverter INV2 is connected to an output node of the first inverter INV1.

A first fin F1, a second fin F2, a third fin F3, and a fourth fin F4 are spaced apart from each other, and extend in parallel to each other in one direction. The extending length of the second fin F2 and the third fin F3 may be smaller than the extending length of the first fin F1 and the fourth fin F4.

A first gate electrode 351, a second gate electrode 352, a third gate electrode 353, and a fourth gate electrode 354 extend in the other direction crossing the direction along which the first and the second fin F1 and F2 extend. For example, the first gate electrode 351 crosses the first fin F1 and the second fin F2 and overlaps a part of a vertical end of the third fin F3. The third gate electrode 353 crosses the fourth fin F4 and the third fin F3 and overlaps a part of a vertical end of the second fin F2. The second gate electrode 352 and the fourth gate electrode 354 cross the first fin F1 and the fourth fin F4, respectively.

As illustrated in FIG. 8, the first pull-up transistor PU1 is defined around a region where the first gate electrode 351 and the second fin F2 cross each other, the first pull-down transistor PD1 is defined around a region where the first gate electrode 351 and the first fin F1 cross each other, and the first pass transistor PS1 is defined around a region where the second gate electrode 352 and the first fin F1 cross each other. The second pull-up transistor PU2 is defined around a region where the third gate electrode 353 and the third fin F3 cross each other, the second pull-down transistor PD2 is defined around a region where the third gate electrode 353 and the fourth fin F4 cross each other, and the second pass transistor PS2 is defined around a region where the fourth gate electrode 354 and the fourth fin F4 cross each other.

The first to fourth gate electrodes 351 to 354 and the first to fourth fins F1 to F4 cross each other, and the source/drain may be formed in the recess.

A plurality of contacts 350 may be formed.

The second fin F2, the third gate electrode 353, and a wiring 371 are connected to each other using a shared contact 362. The third fin F3, the first gate electrode 351, and a wiring 372 are connected to each other using a shared contact 363.

All the first pull-up transistor PU1, the first pull-down transistor PD1, the first pass transistor PS1, the second pull-up transistor PU2, the second pull-down transistor PD2, and the second pass transistor PS2 may be implemented by fin transistors according to an exemplary embodiment of the present inventive concept, and may have the configuration as described above using FIGS. 1 to 6.

Hereinafter, referring to FIGS. 10 to 14, a method for fabricating a semiconductor device according to an exemplary embodiment of the present inventive concept will be described.

FIGS. 10 to 14 are perspective views illustrating a method for fabricating a semiconductor device according to an exemplary embodiment of the present inventive concept.

Figure 10:
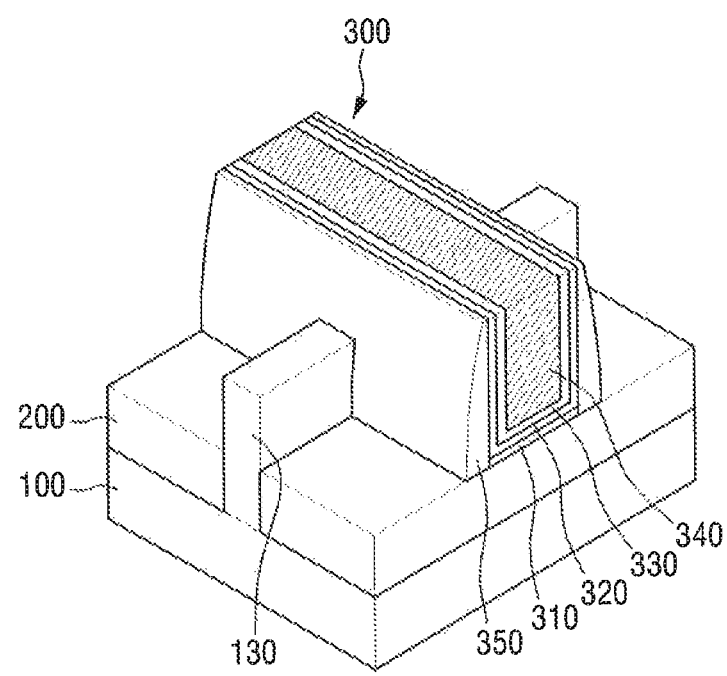
FIGS. 10 to 14 are views of illustrating a method for fabricating a semiconductor device according to an exemplary embodiment of the present inventive concept.

First, referring to FIG. 10, an active fin 130 is formed on a substrate 100, and a gate pattern 300 is formed in a direction crossing the active fin 130.

The active fin 130 extends along a second direction Y. The active fin 130 may be or need not be integral with the substrate 100. A doping process for adjusting a threshold voltage may be performed on the active fin 130. For an NMOS transistor, an impurity may be boron (B). For a PMOS transistor, the impurity may be phosphorus (P) or arsenide (As). However, the present inventive concept is not limited thereto, and the doping process may be performed using other impurities. The active fin 130 may be formed in various processes, for example, an epitaxial process, an etching process, and the like.

An isolation film pattern 200 is formed on the substrate 100. The isolation film pattern 200 may include at least one of a silicon oxide film, a silicon nitride film, and a silicon oxynitride film. For example, by etching the isolation film using a mask film pattern (not illustrated) as a mask, the isolation film pattern 200 for exposing upper side surfaces of the active fin 130 may be formed. In this case, the height of the exposed upper side surface of the active fin 130 may be adjusted through adjustment of an etching time of the isolation film. The isolation film pattern 200 formed through such an etching process covers lower part of the active fins 130. The isolation film pattern 200 serves to separate the active fins 130 from each other.

On the isolation film pattern 200 and the active fins 130, a gate pattern 300 is formed in a direction crossing the active fin 130. The gate pattern 300 may be formed by sequentially laminating an interface film pattern 310, a gate insulating film pattern 320, a work function adjustment film pattern 330, and a gate metal pattern 340.

Figure 11:
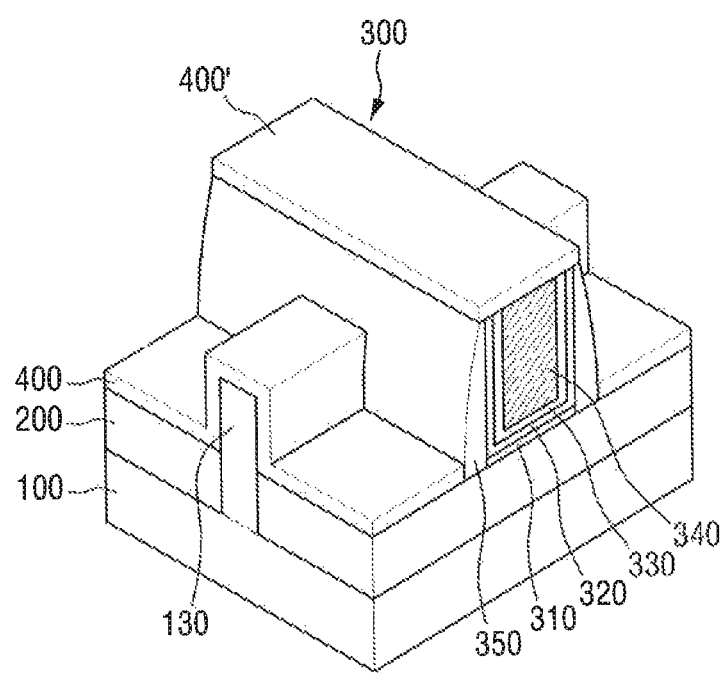

Referring to FIG. 11, an amorphous material is deposited on the active fin 130 and the top surface of the gate structure 300. For example, the amorphous material is selectively deposited on the active fin 130 and the top surface of the gate structure 300, except the spacer 350. The amorphous material may include at least one of Si, Ge, B, As, P, C, and In. After the amorphous material is deposited, the amorphous material is crystallized to form a seed layer 400 having a single crystal structure, and the amorphous material existing on the gate pattern 300 is crystallized into a polycrystalline layer 400'. When the amorphous material is crystallized, a SPE (Solid Phase Epitaxy) process may be used, and for example, the amorphous material may be crystallized using a RTP (Rapid Thermal Process) or an MSA (Milli-Second Anneal) process. In this case, the process temperature may be about 500° C. to about 1300° C.

Figure 12:
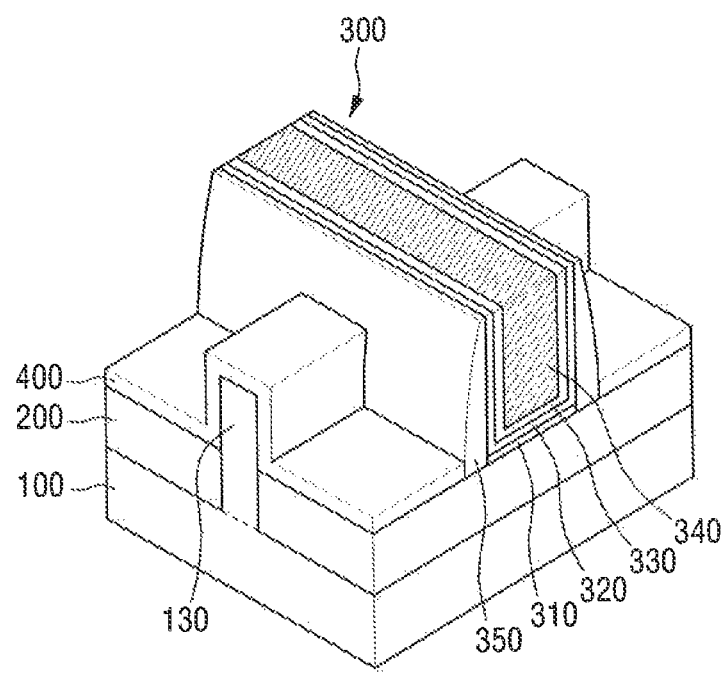

Then, referring to FIG. 12, the polycrystalline layer 400' that exists on the gate pattern 300 is removed. The polycrystalline layer 400' is removed using an etching process (e.g., wet etching or dry etching), and since the polycrystalline layer 400' has an etch rate that is higher than the etch rate of the seed layer 400, it is rapidly etched. For example, since the removal amount of the seed layer 400 is smaller than the removal amount of the polycrystalline layer 400', the seed layer 400 remains after the polycrystalline layer 400' is removed.

Figure 13:
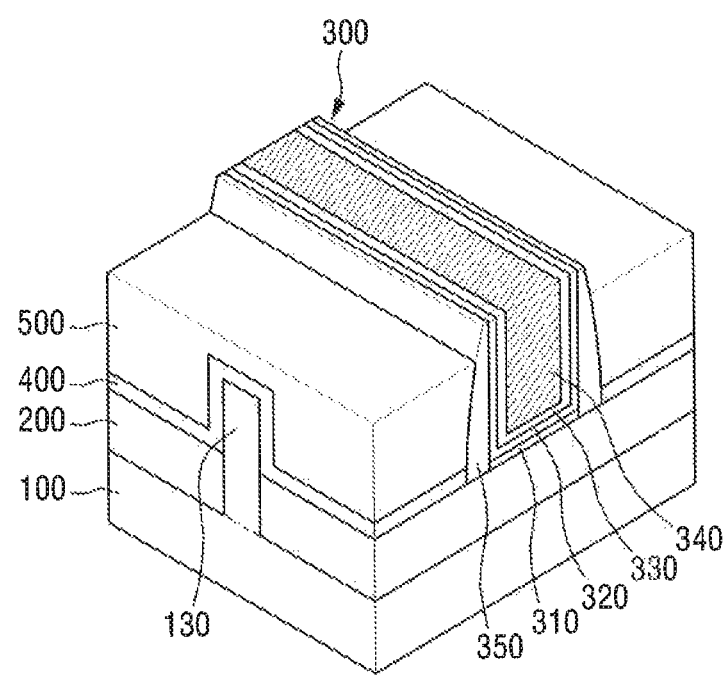

Then, referring to FIG. 13, an epitaxial layer 500 is formed on the seed layer 400. The epitaxial layer 500 is epitaxially grown on the seed layer 400, and the concentration of the stress material (e.g., Ge) included in the epitaxial layer 500 may be higher than the concentration of the stress material (e.g., Ge) included in the seed layer 400.

Figure 14:
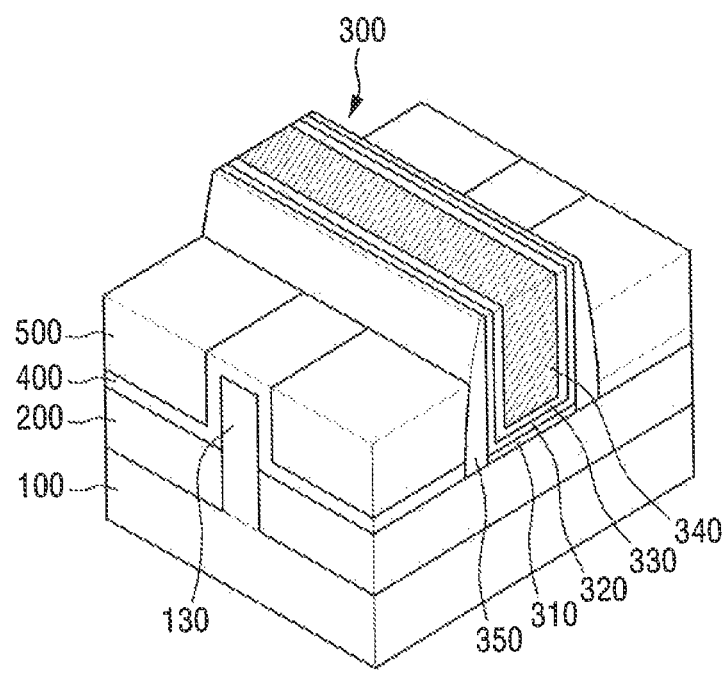

Then, referring to FIG. 14, the epitaxial layer 500 is removed so that an upper surface of the seed layer 400 is exposed. The removal of the upper portion of the epitaxial layer 500 may be performed using an etching process (e.g., wet etching or dry etching).

Hereinafter, referring to FIGS. 10 and 15 to 18, a method for fabricating a semiconductor device according to an exemplary embodiment of the present inventive concept will be described.

FIGS. 15 to 18 are perspective views of intermediate steps explaining a method for fabricating a semiconductor device according to another embodiment of the present inventive concept.

First, referring to FIG. 10, an active fin 130 is formed on a substrate 100, and a gate pattern 300 is formed in a direction crossing the active fin 130.

The active fin 130 extends along a second direction Y. The active fin 130 may be or need not be integral with the substrate 100. A doping process for adjusting a threshold voltage may be performed on the active fin 130. For an NMOS transistor, an impurity may be boron (B). For a PMOS transistor, the impurity may be phosphorus (P) or arsenide (As).

However, the present inventive concept is not limited thereto, and the doping may be performed using other impurities. The active fin 130 may be formed in various processes, for example, an epitaxial process, an etching process, and the like.

An isolation film pattern 200 is formed on the substrate 100. The isolation film pattern 200 may include at least one of a silicon oxide film, a silicon nitride film, and a silicon oxynitride film. For example, by etching the isolation film using a mask film pattern (not illustrated) as a mask, the isolation film pattern 200 exposes upper side surfaces of the active fin 130. The isolation film pattern 200 has an upper surface that is lower than the upper surface of the active fin 130. The height of an upper side wall of the active fin 130 being exposed may be adjusted through adjustment of the etch time of the isolation film. The isolation film pattern 200 serves to separate the active fins 130 from each other.

On the isolation film pattern 200 and the active fins 130, a gate pattern 300 is formed in a direction crossing the active fin 130. The gate pattern 300 may be formed by sequentially laminating an interface film pattern 310, a gate insulating film pattern 320, a work function adjustment film pattern 330, and a gate metal pattern 340.

Figure 15:
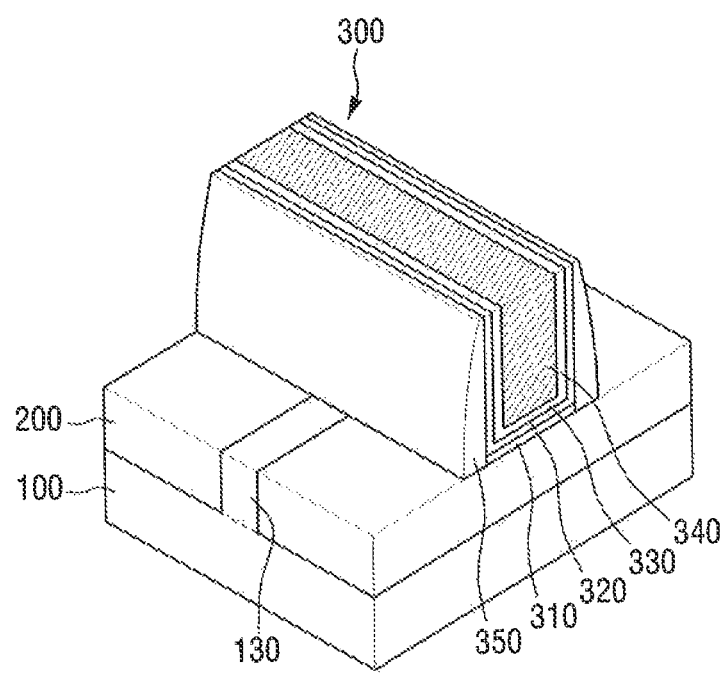
FIGS. 15 to 18 are views of illustrating a method for fabricating a semiconductor device according to an exemplary embodiment of the present inventive concept.

Referring to FIG. 15, after the gate pattern 300 is formed, the exposed active fin 130 which is not covered by the gate pattern 300 is removed. When the exposed active fin 130 is removed, the upper surface of the active fin 130 has substantially the same height as the height of the upper surface of the isolation film.

Figure 16:
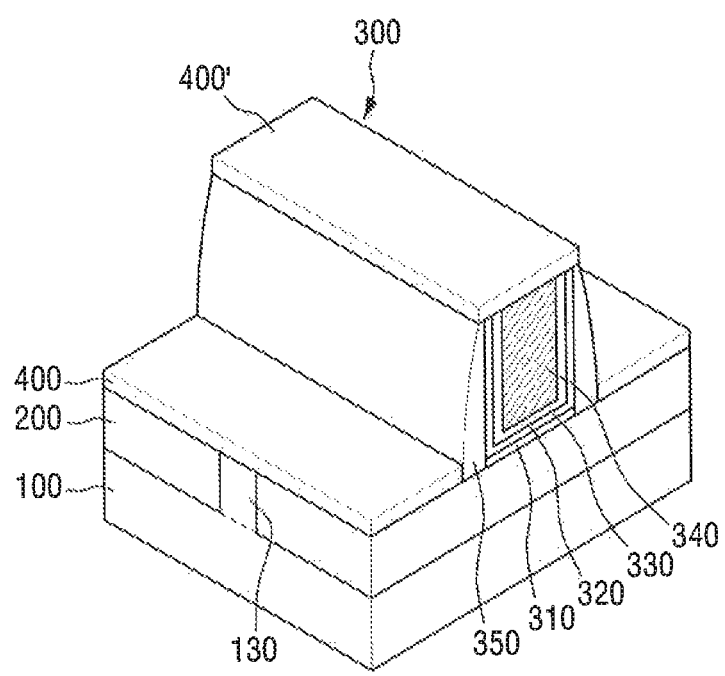

Then, referring to FIG. 16, an amorphous material is deposited on the active fin 130 and the top surface of the gate structure 300. For example, the amorphous material is selectively formed on the active fin 130 and the top surface of the gate structure 300, except for the spacer 350. The amorphous material is in contact with the active fin 130. The amorphous material may include at least one of Si, Ge, B, As, P, C, and In. After the amorphous material is deposited, the amorphous material is crystallized to form a seed layer 400 having a single crystal structure, and the amorphous material existing on the gate pattern 300 is crystallized into a polycrystalline layer 400'. When the amorphous material is crystallized, a SPE (Solid Phase Epitaxy) process may be used, and for example, the amorphous material may be crystallized using a RTP (Rapid Thermal Process) or an MSA (Milli-Second Anneal) process. In this case, the process temperature may be about 500° C. to about 1300° C.

Figure 17:
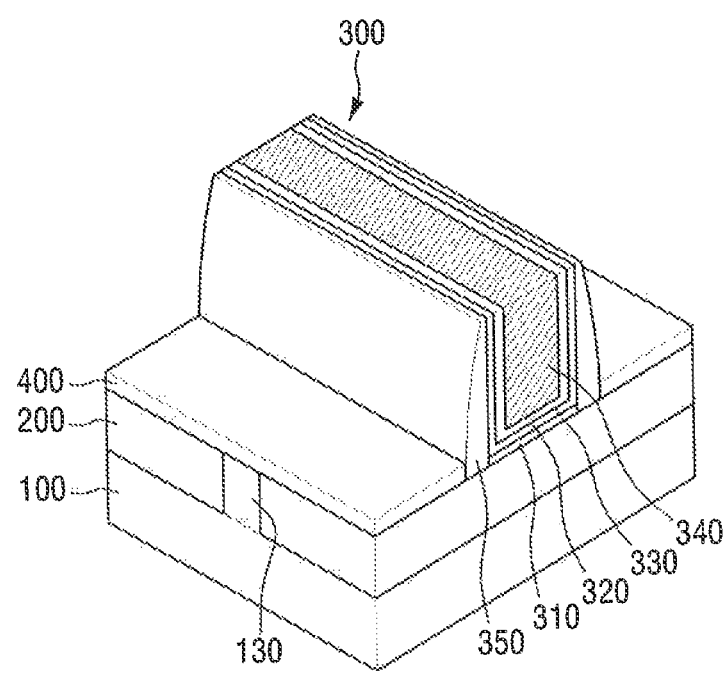

Then, referring to FIG. 17, the polycrystalline layer 400' that exists on the gate pattern 300 is removed. The polycrystalline layer 400' is removed using an etching process (e.g., wet etching or dry etching), and since the polycrystalline layer 400' has an etch rate that is higher than the etch rate of the seed layer 400, it is rapidly etched. That is, since the removal amount of the seed layer 400 is smaller than the removal amount of the polycrystalline layer 400', the seed layer 400 remains after the polycrystalline layer 400' is removed.

Figure 18:
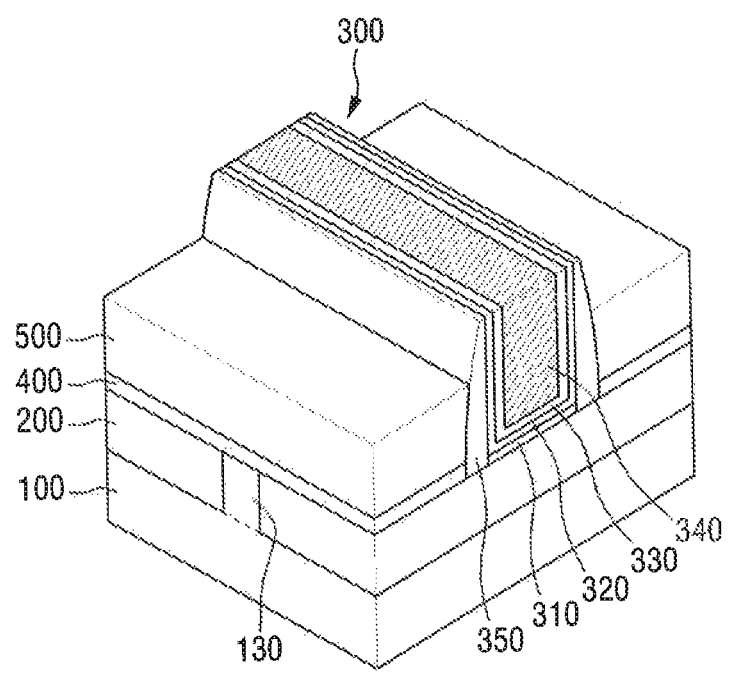

Then, referring to FIG. 18, an epitaxial layer 500 is formed on the seed layer 400. The epitaxial layer 500 is epitaxially grown on the seed layer 400, and the concentration of the stress material (e.g., Ge) included in the epitaxial layer 500 may be higher than the concentration of the stress material (e.g., Ge) included in the seed layer 400.

Figure 19:
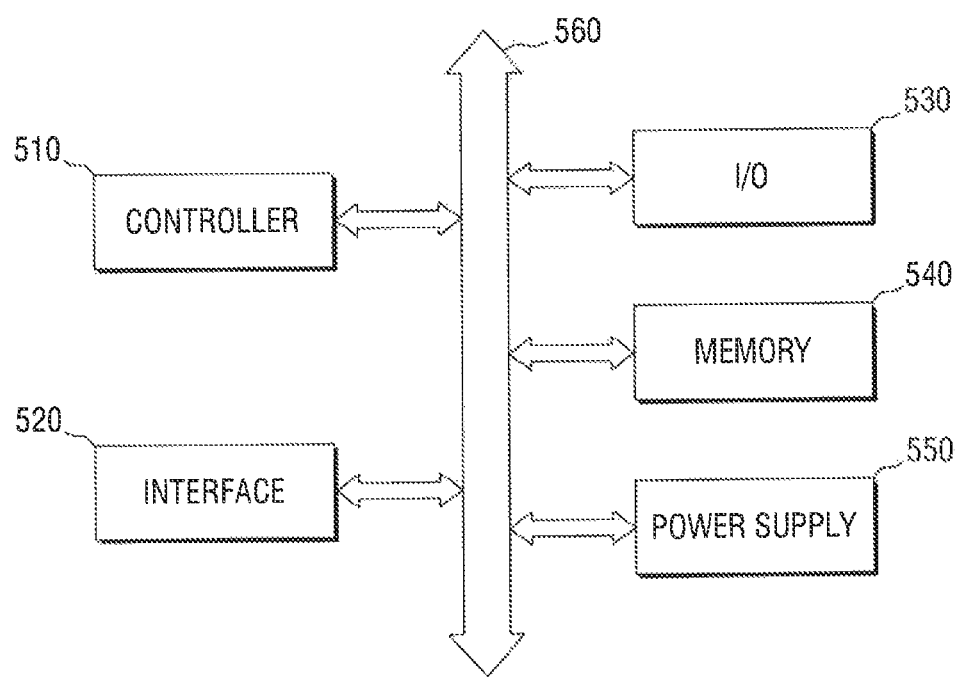
FIG. 19 is a schematic block diagram illustrating an electronic system including a semiconductor device according to an exemplary embodiment of the present inventive concept.

Hereinafter, an electronic system including a semiconductor device according to an exemplary embodiment of the present inventive concept will be described. FIG. 19 is a schematic block diagram illustrating an electronic system including a semiconductor device according to an exemplary embodiment of the present inventive concept.

Referring to FIG. 19, an electronic system includes a controller 510, an interface 520, an input/output (I/O) device 530, a memory 540, a power supply 550, and a bus 560.

The controller 510, the interface 520, the I/O device 530, the memory 540, and the power supply 550 are connected to each other through the bus 560. The bus 560 corresponds to paths through which data is transferred.

The controller 510 may include at least one of a microprocessor, a microcontroller, and logic devices that process data.

The interface 520 may function to transfer data to a communication network or to receive the data from the communication network. The interface 520 may be of a wired or wireless type. For example, the interface 520 may include an antenna or a wire/wireless transceiver.

The I/O device 530 may include a keypad and a display device to input/output data.

The memory 540 may store data and/or commands. The memory 540 may include a semiconductor device according to an exemplary embodiment of the inventive concept.

The power supply 550 may convert a power input from an outside and provide the converted power to the respective constituent elements 510 to 540 of the electronic system.

Figure 20:
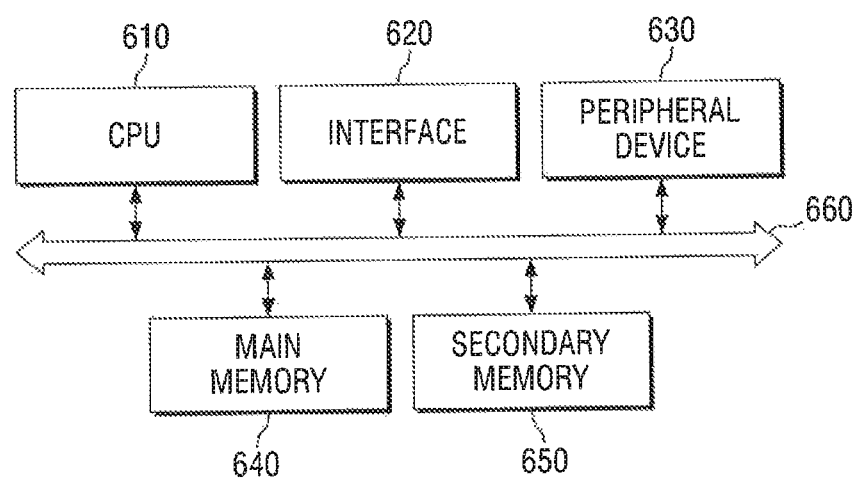
FIG. 20 is a schematic block diagram illustrating an electronic system including a semiconductor device according to an exemplary embodiment of the present inventive concept.

FIG. 20 is a block diagram illustrating an electronic system including a semiconductor device according to an exemplary embodiment of the present inventive concept.

Referring to FIG. 20, an electronic system includes a CPU 610, an interface 620, a peripheral device 630, a main memory 640, a secondary memory 650, and a bus 660.

The CPU 610, the interface 620, the peripheral device 630, the main memory 640, and the secondary memory 650 are connected to each other through the bus 660. The bus 660 corresponds to paths through which data is transferred.

The CPU 610 may include a controller, an arithmetic-logic unit, and the like, and may execute a program to process data.

The interface 620 may function to transfer data to a communication network or to receive the data from the communication network. The interface 620 may be of a wired or wireless type. For example, the interface 620 may include an antenna or a wire/wireless transceiver.

The peripheral device 630 may include a mouse, a keyboard, a display, and a printer, and may input/output data.

The main memory 640 may transmit/receive data with the CPU 610, and may store data and/or commands that are required to execute the program. The main memory 640 may include a semiconductor device according to an exemplary embodiment of the inventive concept.

The secondary memory 650 may include a nonvolatile memory, such as a magnetic tape, a magnetic disc, a floppy disc, a hard disk, or an optical disk, and may store data and/or commands. The secondary memory 650 may store data even in the case where a power of the electronic system is not supplied.

The electronic system a semiconductor device according to an exemplary embodiment of the present inventive concept may be applied to a computer, a UMPC (Ultra Mobile PC), a work station, a net-book, a PDA (Personal Digital Assistants), a portable computer, a web tablet, a wireless phone, a mobile phone, a smart phone, an e-book, a PMP (Portable Multimedia Player), a portable game machine, a navigation device, a black box, a digital camera, a 3-dimensional television receiver, a digital audio recorder, a digital audio player, a digital picture recorder, a digital picture player, a digital video recorder, a digital to video player, a device that can transmit and receive information in a wireless environment, one of various electronic devices constituting a home network, one of various electronic devices constituting a computer network, one of various electronic devices constituting a telematics network, an RFID device, or one of various constituent elements constituting a computing system.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method for fabricating a semiconductor device, comprising:
   forming at least one active fin on a substrate, each active fin protruding from the substrate;
   forming a gate pattern on the substrate, the gate pattern crossing each active fin, the gate pattern covering part of each active fin;
   removing a portion of other part of each active fin;
   forming an amorphous material on the other part of each active fin;

forming a seed layer by crystallizing the amorphous material; and forming an epitaxial layer on the seed layer.

2. The method for fabricating a semiconductor device of claim 1, further comprising forming an isolation film pattern on the substrate and lower side of the other part of the each active fin, wherein an upper surface of the isolation film pattern is lower than an upper surface of the other part of the each active fin.

3. The method for fabricating a semiconductor device of claim 1, further comprising forming an isolation film pattern on the substrate and lower side of the other part of the each active fin, wherein an upper surface of the other part of the each active fin is substantially level with an upper surface of the isolation film pattern.

4. The method for fabricating a semiconductor device of claim 1, wherein the amorphous material comprises Si, Ge, B, As, P, C, or In.

5. The method for fabricating a semiconductor device of claim 1, wherein the amorphous material is contact with the each active fin.

6. The method for fabricating a semiconductor device of claim 1, wherein the crystallizing of the amorphous material is performed using an SPE (Solid Phase Epitaxy) process.

7. The method for fabricating a semiconductor device of claim 1, wherein the epitaxial layer is epitaxially grown on the seed layer.

8. The method for fabricating a semiconductor device of claim 1, wherein the epitaxial and the seed layer include a stress material at a first and a second concentration, respectively, wherein the first concentration is greater than the second concentration.

9. The method for fabricating a semiconductor device of claim 8, wherein the stress material comprises Ge.

10. The method for fabricating a semiconductor device of claim 1, further comprising:
    forming a preliminary isolation film on the substrate and the other part of the each active fin; and
    partially removing the preliminary isolation film and the other part of the each active fin to form an isolation pattern, wherein after the partial removal of the preliminary isolation film and the other part of the each active fin, an upper surface of the isolation pattern is substantially level with an upper surface of the other part of the each active fin.

11. A method for fabricating a semiconductor device, comprising:
    forming a gate pattern on a substrate on which active fins are formed, the gate pattern crossing the active fins;
    forming an amorphous material on the active fins;
    forming a seed layer through crystallizing the amorphous material, the seed layer having a stress material at a first concentration; and
    forming an epitaxial layer on the seed layer, the epitaxial layer having the stress material at a second concentration,
    wherein the second concentration is greater than the first concentration.

12. The method for fabricating a semiconductor device of claim 11, wherein the amorphous material comprises Si, Ge, B, As, P, C, or In.

13. The method for fabricating a semiconductor device of claim 11, wherein the crystallizing of the amorphous material is performed using an SPE (Solid Phase Epitaxy) process.

14. The method for fabricating a semiconductor device of claim 11, wherein the epitaxial layer is epitaxially grown on the seed layer.

15. The method for fabricating a semiconductor device of claim 11, wherein the stress material comprises Ge.

16. The method for fabricating a semiconductor device of claim 11, further to comprising removing the epitaxial layer so that an upper surface of the seed layer is exposed.

* * * * *